(12) United States Patent
Okada et al.

(10) Patent No.: US 10,083,831 B2
(45) Date of Patent: Sep. 25, 2018

(54) SUBSTRATE AND ELECTRONIC DEVICE

(71) Applicant: Sumitomo Electric Industries, Ltd., Osaka-shi (JP)

(72) Inventors: Masaya Okada, Itami (JP); Fuminori Mitsuhashi, Itami (JP); Yasunori Tateno, Yokohama (JP); Masaki Ueno, Itami (JP)

(73) Assignee: Sumitomo Electric Industries, Ltd., Osaka-shi (JP)

( * ) Notice: Subject to any disclaimer, the term of this patent is extended or adjusted under 35 U.S.C. 154(b) by 0 days.

(21) Appl. No.: 15/454,327

(22) Filed: Mar. 9, 2017

(65) Prior Publication Data
US 2017/0263453 A1 Sep. 14, 2017

(30) Foreign Application Priority Data

Mar. 10, 2016 (JP) .................................. 2016-046988
Dec. 1, 2016 (JP) .................................. 2016-234450

(51) Int. Cl.
*H01L 21/02* (2006.01)
*H01L 29/786* (2006.01)
*H01L 29/16* (2006.01)
*H01L 29/04* (2006.01)

(52) U.S. Cl.
CPC .. *H01L 21/02527* (2013.01); *H01L 21/02389* (2013.01); *H01L 21/02417* (2013.01); *H01L 21/02609* (2013.01); *H01L 29/045* (2013.01); *H01L 29/1606* (2013.01); *H01L 29/78603* (2013.01); *H01L 29/78684* (2013.01)

(58) Field of Classification Search
CPC combination set(s) only.
See application file for complete search history.

(56) References Cited

U.S. PATENT DOCUMENTS

| 2011/0048625 A1 | 3/2011 | Caldwell et al. |
| 2013/0214253 A1* | 8/2013 | Hiura .................. H01L 21/0237 257/29 |
| 2013/0272951 A1 | 10/2013 | Hiura et al. |

(Continued)

FOREIGN PATENT DOCUMENTS

JP   2015-048258 A   3/2015

OTHER PUBLICATIONS

U.S. Appl. No. 15/491,738, filed Apr. 19, 2017.
(Continued)

*Primary Examiner* — Mamadou Diallo
(74) *Attorney, Agent, or Firm* — Venable LLP; Michael A. Sartori; Kerri M. Patterson (57) ABSTRACT

A substrate includes: a support substrate having a first main surface and a surface layer region which includes at least the first main surface and is formed of any one material selected from the group consisting of boron nitride, molybdenum disulfide, tungsten disulfide, niobium disulfide, and aluminum nitride; and a graphene film disposed on the first main surface and having an atomic arrangement oriented in relation to an atomic arrangement of the material forming the surface layer region. Accordingly, the substrate is provided that enables a high mobility to be stably ensured in an electronic device manufactured to include the graphene film forming an electrically conductive portion.

7 Claims, 11 Drawing Sheets

(56) References Cited

U.S. PATENT DOCUMENTS

2015/0338322 A1* 11/2015 Damiano, Jr. ........... G01N 1/36
73/864.91
2016/0137507 A1* 5/2016 You ..................... C01B 31/0438
428/408

OTHER PUBLICATIONS

U.S. Appl. No. 15/491,690, filed Apr. 19, 2017.
Non-Final Rejection in related U.S. Appl. No. 15/491,738, dated Oct. 19, 2017.
Office Action issued in U.S. Appl. No. 15/491,690, dated Nov. 24, 2017.
Office Action issued in U.S. Appl. No. 15/491,690, dated May 15, 2018.
Office Action dated Jul. 24, 2018 in U.S. Appl. No. 15/491,738.

* cited by examiner

SUBSTRATE AND ELECTRONIC DEVICE

BACKGROUND OF THE INVENTION

Field of the Invention

The present invention relates to a substrate and an electronic device. The present application claims priority to Japanese Patent Application No. 2016-046988 filed on Mar. 10, 2016 and Japanese Patent Application No. 2016-234450 filed on Dec. 1, 2016, and the entire contents of which are hereby incorporated by reference.

Description of the Background Art

Graphene is a material in which carbon atoms form an $sp^2$ hybrid orbital and the carbon atoms are bonded two-dimensionally. Graphene in which carbon atoms are bonded in such a condition has a feature that the carrier mobility is remarkably high. Therefore, by use of a graphene film as a channel of an electronic device such as transistor, for example, the electronic device is expected to be increased in switching speed.

An electronic device in which a graphene film is used as an electrically conductive portion (channel for example) can be manufactured by forming a substrate including the graphene film and forming electrodes or the like on the substrate. The substrate including the graphene film can be formed for example by bonding to a support substrate a graphene thin film exfoliated from graphite, or bonding to a support substrate a graphene thin film grown by CVD (Chemical Vapor Deposition).

In order to ensure an acceptable production efficiency in mass production of electronic devices, it is preferable to use, in the above-described substrate, a support substrate having a large diameter (having a diameter of two inches or more, for example). In the substrate formed through a procedure including bonding of a graphene film as described above, a large region without the graphene film is included in the surface of the support substrate. In such a case, a process for manufacturing an electronic device, such as positional alignment for forming electrodes, is difficult to automate. A resultant problem is that mass production of electronic devices in which the aforementioned substrate is used is difficult.

In contrast, a method has been proposed according to which a substrate made of SiC (silicon carbide) is heated to desorb Si atoms and thereby transform a surface layer of the substrate into graphene, and accordingly the substrate in which the graphene film is formed on a support substrate is produced (see Japanese Patent Laying-Open No. 2015-48258 for example). Thus, in the main surface of the substrate, the region without the graphene film is reduced. As a result of this, mass production of electronic devices in which the substrate is used is facilitated.

SUMMARY OF THE INVENTION

A substrate of the present disclosure includes: a support substrate having a first main surface and a surface layer region which includes at least the first main surface and is formed of any one material selected from the group consisting of boron nitride (BN), molybdenum disulfide ($MoS_2$), tungsten disulfide ($WS_2$), niobium disulfide ($NbS_2$), and aluminum nitride (AlN); and a graphene film disposed on the first main surface and having an atomic arrangement oriented in relation to an atomic arrangement of the material forming the surface layer region.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Problems to be Solved by the Disclosure

In the case where a substrate in which a graphene film is formed on a support substrate made of SiC as described above is used to manufacture an electronic device in which the graphene film forms an electrically conductive portion, the mobility in the electrically conductive portion may be lower than an expected value of the mobility.

In view of the above, one object is to provide a substrate and an electronic device including the substrate that enable a high mobility to be stably ensured in the electronic device manufactured to include the graphene film forming an electrically conductive portion.

Effects of the Disclosure

With the substrate as described above, a high mobility can stably be ensured in an electronic device manufactured to include the graphene film forming an electrically conductive portion.

DESCRIPTION OF EMBODIMENTS OF THE INVENTION

Initially, aspects of the present invention will be described one by one. A substrate of the present application includes:

a support substrate having a first main surface and a surface layer region which includes at least the first main surface and is formed of any one material selected from the group consisting of boron nitride (BN), molybdenum disulfide ($MoS_2$), tungsten disulfide ($WS_2$), niobium disulfide ($NbS_2$), and aluminum nitride (AlN); and a graphene film disposed on the first main surface and having an atomic arrangement oriented in relation to an atomic arrangement of the material forming the surface layer region.

As to the case where a substrate in which a graphene film is formed on a support substrate made of SiC is used to manufacture an electronic device in which the graphene film forms an electrically conductive portion, the inventors of the present invention have studied the reasons why the mobility in the electrically conductive portion is lower than an expected value of the mobility. As a result, the inventors have found that the graphene film having an atomic arrangement oriented in relation to an atomic arrangement of SiC forming the support substrate includes regions in which the graphene film thickness is partially larger, and the presence of these regions significantly influences the mobility. Moreover, through the inventors' study, it has been clarified that, in the case where the surface layer region including at least the first main surface is formed not on the support substrate made of SiC but on a support substrate formed of any one material selected from the group consisting of BN, $MoS_2$, $WS_2$, $NbS_2$, and AlN and a graphene film having an atomic arrangement oriented in relation to an atomic arrangement of the material forming the surface layer region is formed, formation of a region where the thickness of the graphene film is larger can be suppressed.

Regarding the substrate of the present application, the surface layer region of the support substrate includes at least the first main surface and is made of any one material selected from the group consisting of BN, $MoS_2$, $WS_2$, $NbS_2$, and AlN, and a graphene film having an atomic arrangement oriented in relation to an atomic arrangement of the material forming the surface layer region is formed on the first main surface of the support substrate. It is therefore possible to suppress formation of a region where the thickness of the graphene film is larger. As a result, the substrate of the present application can be provided that enables a high mobility to be stably ensured in an electronic device manufactured to include the graphene film forming an electrically conductive portion.

In the substrate, the graphene film may cover 80% or more of the first main surface. Accordingly, the region where the graphene film is absent in the first main surface of the support substrate is reduced. As a result, mass production of electronic devices in which the substrate is used is facilitated.

In the substrate, the carrier mobility in the graphene film is preferably 5000 $cm^2/Vs$ or more, and more preferably 8000 $cm^2/Vs$ or more. Accordingly, the switching speed of an electronic device manufactured with the substrate can be increased.

In the substrate, the surface layer region may be formed of boron nitride. Boron nitride is particularly suitable for a material forming the surface layer region.

In the substrate, the support substrate may include: a base substrate; and a support layer disposed on the base substrate, formed of a material different from the base substrate, and including the first main surface. The support layer may be the surface layer region. In the case where the support substrate having such a structure is used, the substrate can also be provided that enables a high mobility to be stably ensured in an electronic device manufactured to include the graphene film forming an electrically conductive portion.

In the substrate, a region occupying 20% or more by area of the graphene film as seen in plan view may have an atomic arrangement oriented in relation to an atomic arrangement of the material forming the surface layer region. Accordingly, the substrate can more reliably be provided that enables a high mobility to be stably ensured in an electronic device manufactured to include the graphene film forming an electrically conductive portion.

In the substrate, the support substrate may have a disk shape. The support substrate may have a diameter of 50 mm or more. Accordingly, the efficiency of manufacture of an electronic device in which the substrate is used can be increased.

An electronic device of the present application includes the substrate, a first electrode disposed on an exposed surface of the graphene film that is a main surface opposite to the support substrate, and a second electrode disposed on the exposed surface and spaced from the first electrode.

In the electronic device of the present application, the first electrode and the second electrode are formed on the exposed surface of the substrate of the present application. Therefore, in the electronic device of the present application, a high mobility in the electrically conductive portion can be stably ensured.

DETAILS OF EMBODIMENTS OF THE INVENTION

Next, an embodiment of the substrate in accordance with the present invention will be described below with reference to the drawings. In the following drawings, the same or corresponding parts are denoted by the same reference numerals, and a description thereof will not be repeated.

First Embodiment

Figure 1:
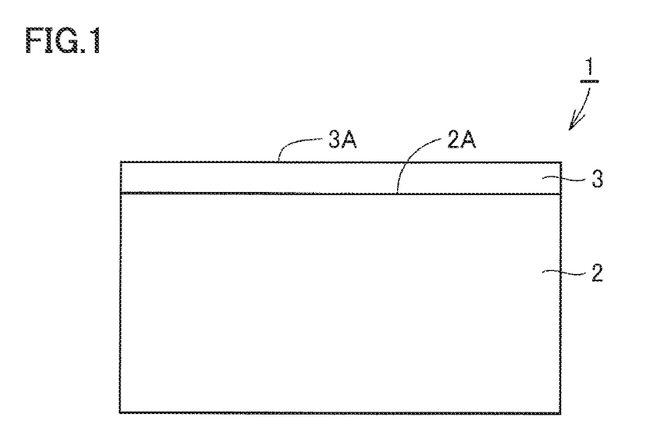
FIG. 1 is a schematic cross-sectional view showing a structure of a substrate including a graphene film in a first embodiment.

Referring to FIG. 1, a substrate 1 of the present embodiment includes a support substrate 2 and a graphene film 3. Support substrate 2 is formed of BN. BN forming support substrate 2 is hexagonal BN. Namely, support substrate 2 is a hexagonal BN bulk substrate. Support substrate 2 has a disk shape. Support substrate 2 has a diameter of two inches or more (50 mm or more). Support substrate 2 has a first main surface 2A. First main surface 2A is a main surface forming an angle of 1° or less with a c-plane ({0001} plane). On first main surface 2A, a crystal plane where atoms are present at the positions corresponding to respective apexes of a hexagon is exposed. On first main surface 2A, the c-plane of the hexagonal BN is exposed.

Graphene film 3 is disposed on first main surface 2A of support substrate 2. Graphene film 3 has an exposed surface 3A which is a main surface opposite to support substrate 2. Graphene film 3 is formed of graphene having an atomic arrangement oriented in relation to an atomic arrangement of BN forming support substrate 2. The condition in which an atomic arrangement of graphene forming graphene film 3 is oriented in relation to an atomic arrangement of BN forming support substrate 2 means that the atomic arrangement of graphene has a certain relation with the atomic arrangement of BN forming support substrate 2. Whether or not the atomic arrangement of graphene is oriented in relation to the atomic arrangement of BN can be confirmed for example by the LEED (Low Energy Electron Diffraction) method.

Regarding substrate 1 of the present embodiment, on first main surface 2A on which the c-plane of the hexagonal BN is exposed, graphene film 3 having an atomic arrangement oriented in relation to an atomic arrangement of the material forming support substrate 2 is formed. Therefore, formation of a large-thickness region of graphene film 3 is suppressed. As a result, substrate 1 is a substrate that enables a high mobility to be stably ensured in an electronic device manufactured to include the graphene film forming an electrically conductive portion.

Preferably, graphene film 3 covers 80% or more by area of first main surface 2A of support substrate 2. Accordingly, the region where graphene film 3 is absent in first main surface 2A of support substrate 2 is reduced. As a result, mass production of electronic devices in which substrate 1 is used is facilitated.

The carrier mobility in graphene film 3 is preferably 5000 $cm^2/Vs$ or more, and more preferably 8000 $cm^2/Vs$ or more. Accordingly, the switching speed of an electronic device manufactured with substrate 1 can be increased.

Preferably, a region occupying 20% or more by area of graphene film 3 as seen in plan view has an atomic arrangement oriented in relation to an atomic arrangement of the material forming support substrate 2. Accordingly, more reliably a high mobility can be stably ensured in an electronic device manufactured to include graphene film 3 forming an electrically conductive portion.

Figure 2:
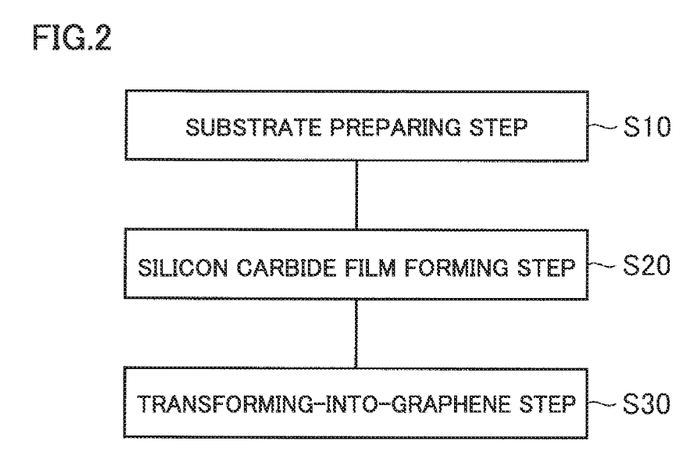
FIG. 2 is a flowchart generally showing a method for manufacturing a substrate including a graphene film.
Figure 3:
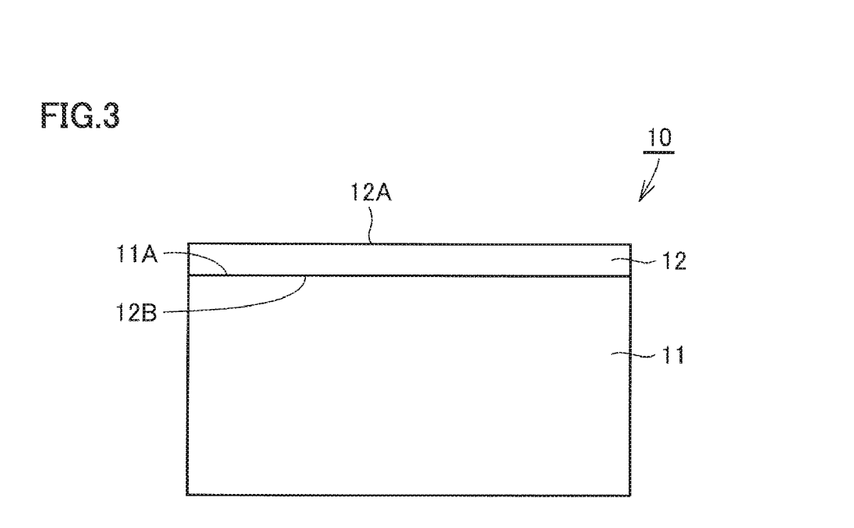
FIG. 3 is a schematic cross-sectional view for illustrating a method for manufacturing a substrate in the first embodiment.
Figure 4:
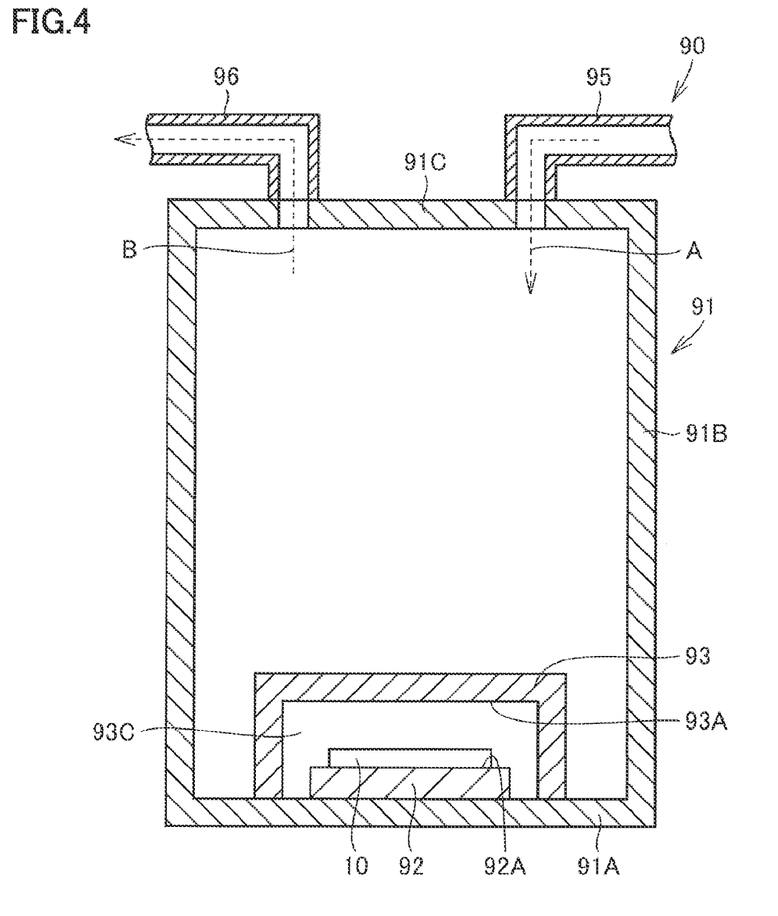
FIG. 4 is a schematic cross-sectional view showing a structure of a heating apparatus.

Referring next to FIGS. 2 to 4, a method for manufacturing substrate 1 of the present embodiment will generally be described.

Referring to FIG. 2, in the method for manufacturing substrate 1 of the present embodiment, initially a substrate preparing step is performed as a step (S10). Referring to FIG. 3, in this step (S10), a substrate 11 made of hexagonal BN and having a diameter of two inches (50.8 mm) for example is prepared. More specifically, an ingot made of BN is sliced to obtain substrate 11 made of BN. The surface of substrate 11 is polished and thereafter subjected to a process such as washing. In this way, substrate 11 having its main surface with ensured flatness and cleanliness is obtained. Substrate 11 has a first main surface 11A. First main surface 11A is a main surface forming an angle of 1° or less with a c-plane of BN forming substrate 11, namely with {0001} plane. In other words, first main surface 11A is substantially a c-plane.

Next, a silicon carbide film forming step is performed as a step (S20). Referring to FIG. 3, in this step (S20), an SiC film 12 made of silicon carbide is formed on first main surface 11A of substrate 11. Specifically, on first main surface 11A of substrate 11, SiC film 12 is formed by sputtering, for example. SiC film 12 is made of amorphous or polycrystalline SiC, for example. The thickness of SiC film 12 may for example be 0.5 nm or more and 5 nm or less. The step (S20) is thus performed to obtain a material substrate 10 including substrate 11 and SiC film 12 formed on first main surface 11A of substrate 11.

Next, a transforming-into-graphene step is performed as a step (S30). This step (S30) can be performed with a heating apparatus shown in FIG. 4, for example. Referring to FIG. 4, heating apparatus 90 includes a main body 91, a susceptor 92, a cover member 93, a gas inlet tube 95, and a gas outlet tube 96.

Main body 91 includes a side wall 91B having a hollow cylindrical shape, a bottom wall 91A closing a first end of side wall 91B, and a top wall 91C closing a second end of side wall 91B. On bottom wall 91A within main body 91, susceptor 92 is disposed. Susceptor 92 has a substrate holding surface 92A for holding material substrate 10.

In main body 91, cover member 93 is disposed to cover susceptor 92. Cover member 93 has a hollow cylindrical shape having a pair of ends, with one end closed and the other end opened, for example. Cover member 93 is disposed so that the other end of cover member 93 is in contact with bottom wall 91A. Susceptor 92 and material substrate 10 on susceptor 92 are surrounded by cover member 93 and bottom wall 91A of main body 91. In a closed space 93C which is a space surrounded by cover member 93 and bottom wall 91A of main body 91, susceptor 92 and material substrate 10 on susceptor 92 are disposed. An inner wall surface 93A of cover member 93 faces a main surface 12A of SiC film 12 in material substrate 10, namely the main surface opposite to substrate 11 (see FIG. 3).

Gas inlet tube 95 and gas outlet tube 96 are connected to top wall 91C of main body 91. Gas inlet tube 95 and gas outlet tube 96 each have one end connecting to a through hole formed in top wall 91C. The other end of gas inlet tube 95 is connected to a gas retainer retaining an inert gas (not shown). In the present embodiment, argon is retained in the gas retainer. The other end of gas outlet tube 96 is connected to an exhaust device such as pump (not shown).

The step (S30) can be carried out using heating apparatus 90 in the following way. Initially, on substrate holding surface 92A of susceptor 92, material substrate 10 prepared in the step (S20) is disposed. Then, cover member 93 is disposed on bottom wall 91A so as to cover susceptor 92 and material substrate 10. Accordingly, susceptor 92 as well as material substrate 10 on susceptor 92 are surrounded by cover member 93 and bottom wall 91A of main body 91.

Next, a valve (not shown) disposed in gas inlet tube 95 is closed while a valve disposed in gas outlet tube 96 is opened. Then, the exhaust device connected to gas outlet tube 96 is operated to cause gas in main body 91 to be discharged from gas outlet tube 96 along arrow B. Accordingly, the inside of main body 91 is decompressed. While susceptor 92 and material substrate 10 are surrounded by cover member 93 and bottom wall 91A of main body 91, cover member 93 is not joined to bottom wall 91A. Therefore, as the inside of main body 91 is further decompressed, the pressure difference between the inside and the outside of closed space 93C causes the internal gas to be discharged from a slight gap between cover member 93 and bottom wall 91A. As a result, the inside of closed space 93C is also decompressed.

Next, the operation of the exhaust device is stopped and the valve disposed in gas inlet tube 95 is opened. Accordingly, argon retained in the gas retainer is introduced into main body 91 through gas inlet tube 95 (arrow A). As the pressure in main body 91 increases, the pressure difference between the inside and the outside of closed space 93C causes argon to enter the closed space through a slight gap between cover member 93 and bottom wall 91A. In this way, the gas in main body 91 is replaced with argon. As the pressure of argon in main body 91 increases to the normal pressure (atmospheric pressure), extra argon is discharged from gas outlet tube 96. The pressure in main body 91 is thus kept at the normal pressure. Namely, in main body 91, an argon atmosphere at the normal pressure is maintained.

Next, material substrate 10 is heated. Main body 91 for example is heated to thereby cause material substrate 10 to be heated. Main body 91 may be heated by induction heating, for example. Material substrate 10 is heated in normal-pressure argon to a temperature of 1300° C. or more and 1800° C. or less, for example. Accordingly, with reference to FIG. 3, Si atoms are desorbed from SiC forming SiC film 12, and a surface layer of SiC film 12, which is a region opposite to substrate 11 and including main surface 12A, is transformed into graphene. Meanwhile, the substrate 11 side main surface 12B of SiC film 12 is in contact with substrate 11. Therefore, this heating causes an atomic arrangement in the region including main surface 12B to be oriented in relation to the atomic arrangement of BN forming substrate 11. As a result, the atomic arrangement of graphene generated through transformation of SiC film 12 is oriented in relation to the atomic arrangement of BN forming substrate 11. Referring to FIG. 1, in this way, substrate 1 is obtained that includes support substrate 2 made of BN, and graphene film 3 disposed on first main surface 2A of support substrate 2 and having an atomic arrangement oriented in relation to the atomic arrangement of BN forming support substrate 2.

Through this procedure, substrate 1 of the present embodiment is completed. As described above, cover member 93 is used in the present embodiment. Therefore, Si atoms desorbed from SiC film 12 remain in closed space 93C. Consequently, due to desorbing of Si from SiC film 12, the Si vapor pressure in closed space 93C increases. Thus, rapid transformation of SiC into graphene is suppressed. In this way, the rate at which SiC is transformed into graphene is lowered to thereby form graphene film 3 formed of one atomic layer or a small number of atomic layers (close to one atomic layer).

A region having a large graphene film thickness which influences reduction of the mobility is formed in a region having any surface defect of substrate 11 or damage generated during production of the substrate. In contrast, in the present embodiment, it is not the surface layer of prepared substrate 11 but SiC film 12 formed on substrate 11 that is transformed into graphene. Therefore, even in the case where any defect or damage is present in the surface layer of substrate 11, the region having a large graphene film thickness due to this can be prevented from being formed. As a result, substrate 1 in which a high mobility can stably be ensured can be obtained.

Second Embodiment

Figure 5:
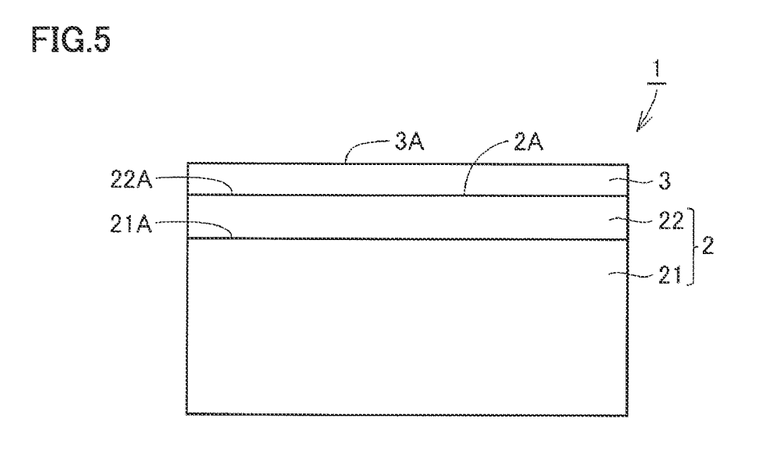
FIG. 5 is a schematic cross-sectional view showing a structure of a substrate including a graphene film in a second embodiment.

Next, a second embodiment which is another embodiment of the substrate of the present application will be described. Referring to FIG. 5, a substrate 1 in the second embodiment basically has a similar structure and produces similar effects to the first embodiment. Substrate 1 in the second embodiment, however, differs from the first embodiment in terms of the structure of support substrate 2.

Referring to FIG. 5, a support substrate 2 in the second embodiment includes a carbon substrate 21 as a base substrate made of carbon (graphite), and a BN film 22 which is formed on one main surface 21A of carbon substrate 21 and serves as a support layer made of BN. BN forming BN film 22 which is a surface layer region is hexagonal BN. BN film 22 can be formed on one main surface 21A of carbon substrate 21 by CVD (Chemical Vapor Deposition), for example. The thickness of BN film 22 can be 0.1 nm or more and 1 mm or less, for example. Support substrate 2 has a first main surface 2A. First main surface 2A (main surface 22A of BN film 22 that is opposite to carbon substrate 21) is a main surface forming 1° or less with a c-plane ({0001} plane). On first main surface 2A, a crystal plane where atoms are present at the positions corresponding to respective apexes of a hexagon is exposed. On first main surface 2A, the c-plane of the hexagonal BN is exposed. Support substrate 2 includes a surface layer region which includes first main surface 2A and which is formed of BN.

Graphene film 3 is disposed on first main surface 2A of support substrate 2. Graphene film 3 is made of graphene having an atomic arrangement oriented in relation to an atomic arrangement of BN forming BN film 22 (surface layer region of support substrate 2). The condition in which an atomic arrangement of graphene forming graphene film 3 is oriented in relation to an atomic arrangement of BN forming support substrate 2 means that the atomic arrangement of graphene has a certain relation with the atomic arrangement of BN forming support substrate 2. Whether or not the atomic arrangement of graphene is oriented in relation to the atomic arrangement of BN can be confirmed for example by the LEED (Low Energy Electron Diffraction) method.

Regarding substrate 1 of the present embodiment, BN film 22 has main surface 22A which is opposite to carbon substrate 21 and on which the c-plane of the hexagonal BN is exposed and, on this main surface 22A, graphene film 3 having an atomic arrangement oriented in relation to an atomic arrangement of the material forming BN film 22 is formed. Therefore, formation of a large-thickness region of graphene film 3 is suppressed. As a result, substrate 1 is a substrate that enables a high mobility to be stably ensured in an electronic device manufactured to include graphene film 3 forming an electrically conductive portion.

Substrate 1 in the second embodiment can be manufactured through a procedure as follows.

Figure 6:
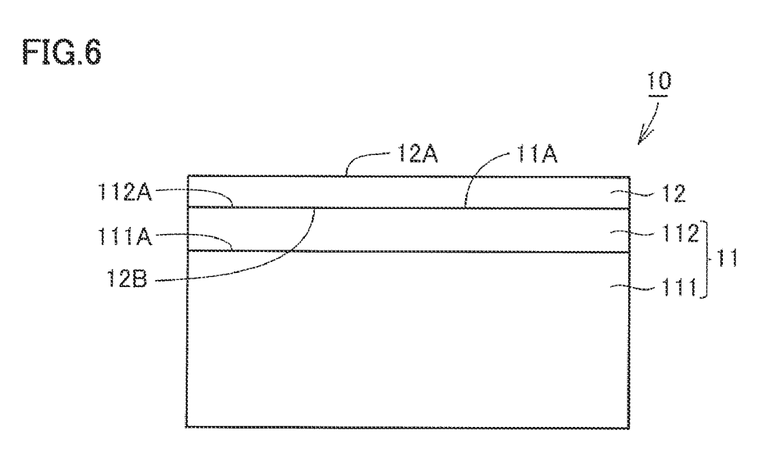
FIG. 6 is a schematic cross-sectional view for illustrating a method for manufacturing a substrate in the second embodiment.

Referring to FIG. 2, in a method for manufacturing substrate 1 in the second embodiment, initially a substrate preparing step is performed as a step (S10). Referring to FIG. 6, in this step (S10), a substrate 11 is prepared that has a structure in which a BN film 112 made of hexagonal BN is formed on one main surface 111A of a carbon substrate 111 having a diameter of two inches (50.8 mm), for example. More specifically, on one main surface 111A of carbon substrate 111, BN film 112 made of hexagonal BN is deposited by CVD, for example. In this way, substrate 11 is obtained. Substrate 11 has a first main surface 11A. First main surface 11A is a main surface forming an angle of 1° or less with a c-plane of BN forming BN film 112, namely with {0001} plane. In other words, first main surface 11A is substantially a c-plane.

Next, a silicon carbide film forming step is performed as a step (S20). This step (S20) is performed similarly to the first embodiment. Accordingly, a material substrate 10 including substrate 11 and SiC film 12 formed on first main surface 11A of substrate 11 is obtained.

Next, a transforming-into-graphene step is performed as a step (S30). This step (S30) is performed with heating apparatus 90 in a similar manner to the first embodiment. Accordingly, with reference to FIG. 6, Si atoms are desorbed from SiC forming SiC film 12, and a surface layer of SiC film 12, which is a region opposite to substrate 11 and including main surface 12A, is transformed into graphene. Meanwhile, the substrate 11 side main surface 12B of SiC film 12 is in contact with substrate 11. Therefore, this heating causes an atomic arrangement in the region including main surface 12B to be oriented in relation to the atomic arrangement of BN forming BN film 112. As a result, the atomic arrangement of graphene generated through transformation of SiC film 12 is oriented in relation to the atomic arrangement of BN forming BN film 112. Referring to FIG. 5, in this way, substrate 1 is obtained that includes: support substrate 2 in which a surface layer region including first main surface 2A is made of BN; and graphene film 3 disposed on first main surface 2A of support substrate 2 and having an atomic arrangement oriented in relation to the atomic arrangement of BN forming BN film 22. Through the above-described procedure, substrate 1 in the second embodiment that produces similar effects to those of the first embodiment can be obtained.

While the first embodiment is described above in connection with the case where support substrate 2 is made of BN, support substrate 2 may be formed of $MoS_2$, $WS_2$, $NbS_2$, or AlN. Moreover, while the second embodiment is described above in connection with the case where BN film 22 is formed on carbon substrate 21, $MoS_2$ film, $WS_2$ film, $NbS_2$ film, or AlN film may be used instead of BN film 22. At this time, on first main surface 2A, a crystal plane is exposed where atoms are present at the positions corresponding to respective apexes of a hexagon. Such a substrate 1 can be manufactured by using $MoS_2$, $WS_2$, $NbS_2$, or AlN instead of BN in the above-described embodiments. Moreover, while the second embodiment is described above in connection with the case where carbon substrate 21 is used as a base substrate of support substrate 2, the base substrate is not limited to this, and boron nitride (BN) substrate, silicon carbide (SiC) substrate, silicon nitride ($Si_3N_4$) substrate, aluminum nitride (AlN) substrate, alumina ($Al_2O_3$) substrate, molybdenum (Mo) substrate, tungsten (W) substrate, tantalum (Ta) substrate, molybdenum carbide (MoC) substrate, tantalum carbide (TaC) substrate, or tungsten carbide (WC) substrate may be used.

Third Embodiment

Figure 7:
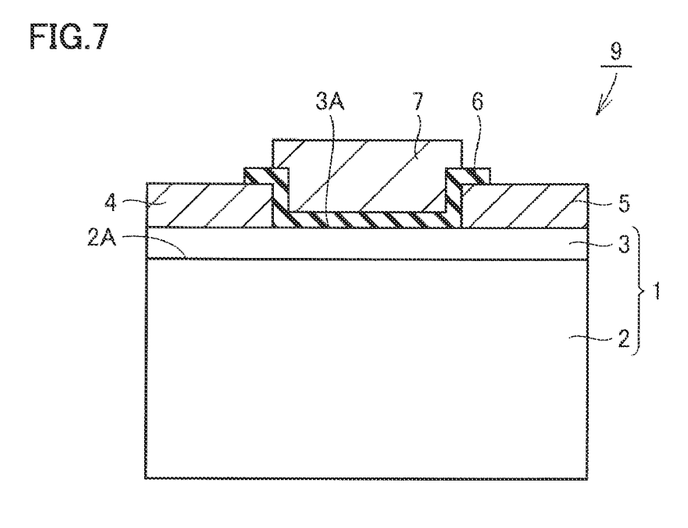
FIG. 7 is a schematic cross-sectional view showing a structure of a field effect transistor (FET) including a graphene film.

Next, a description will be given of an FET (Field Effect Transistor) which is an example of the electronic device produced with substrate 1 of the first embodiment. Referring to FIG. 7, an FET 9 of the present embodiment is produced with substrate 1 of the first embodiment, and includes substrate 1 including support substrate 2 and graphene film 3 which are stacked like the first embodiment. FET 9 further includes a source electrode 4 as a first electrode, a drain electrode 5 as a second electrode, a gate electrode 7 as a third electrode, and a gate insulating film 6.

Source electrode 4 is formed in contact with exposed surface 3A. Source electrode 4 is formed of a conductor which can make ohmic contact with graphene film 3, such as Ni (nickel)/Au (gold), for example. Drain electrode 5 is formed in contact with exposed surface 3A. Drain electrode 5 is formed to be spaced from source electrode 4. Drain electrode 5 is formed of a conductor which can make ohmic contact with graphene film 3, such as Ni/Au, for example.

Gate insulating film 6 is formed to cover exposed surface 3A of graphene film 3 located between source electrode 4 and drain electrode 5. Gate insulating film 6 not only covers exposed surface 3A located between source electrode 4 and drain electrode 5 but also extends to regions which partially cover the upper surface (the main surface opposite to the surface contacting graphene film 3) of source electrode 4 and drain electrode 5. Gate insulating film 6 is formed of an insulator such as silicon nitride (SiN) or aluminum oxide ($Al_2O_3$), for example.

Gate electrode 7 is disposed to contact the upper surface of gate insulating film 6. Gate electrode 7 is disposed in a region corresponding to exposed surface 3A located between source electrode 4 and drain electrode 5. Gate electrode 7 is formed of a conductor such as Ni/Au, for example.

When FET 9 is in a state that a voltage applied to gate electrode 7 is less than a threshold voltage, namely when FET 9 is in the OFF state, electrons to serve as carriers are not sufficiently present in graphene film 3 (channel region) located between source electrode 4 and drain electrode 5, and the non-conducting state is maintained even when a voltage is applied between source electrode 4 and drain electrode 5. In contrast, when a voltage of the threshold value or more is applied to gate electrode 7 to cause FET 9 to be in the ON state, electrons to serve as carriers are generated in the channel region. As a result, the channel region in which electrons to serve as carriers are generated causes a state where source electrode 4 and drain electrode 5 are electrically connected to each other. When a voltage is applied between source electrode 4 and drain electrode 5 in such a state, current flows between source electrode 4 and drain electrode 5.

As to FET 9 of the present embodiment, source electrode 4 and drain electrode 5 are formed on exposed surface 3A of substrate 1 described above in connection with the first embodiment. Therefore, a high mobility is stably ensured in graphene film 3 corresponding to a channel region as an electrically conductive portion. As a result, FET 9 is an electronic device having the increased switching speed. As a characteristic of FET 9, $R_c$ (contact resistance) of FET 9 is preferably less than 1 Ωcm, and more preferably less than 0.5 Ωcm. Moreover, $R_s$ (sheet resistance) of FET 9 is preferably less than 1000 Ωsq, and more preferably less than 500 Ωsq. Further, $g_m$ (mutual conductance) of FET 9 is preferably more than 100 mS, and more preferably more than 1000 mS. fT (cutoff frequency) of FET 9 is preferably more than 100 GHz, and more preferably more than 1 THz.

Figure 8:
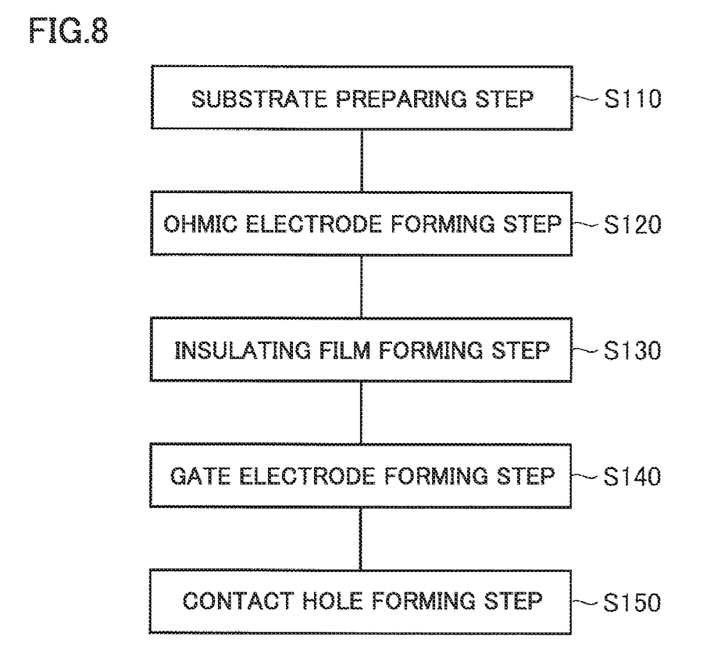
FIG. 8 is a flowchart generally showing a method for manufacturing a field effect transistor including a graphene film.

Referring next to FIG. 1 and FIGS. 7 to 11, a method for manufacturing FET 9 of the present embodiment will be described. Referring to FIG. 8, in the method for manufacturing FET 9 of the present embodiment, a substrate preparing step is performed first as a step (S110). In this step (S110), substrate 1 of the first embodiment is prepared (see FIG. 1). Substrate 1 can be manufactured by the manufacturing method described above in connection with the first embodiment.

Figure 9:
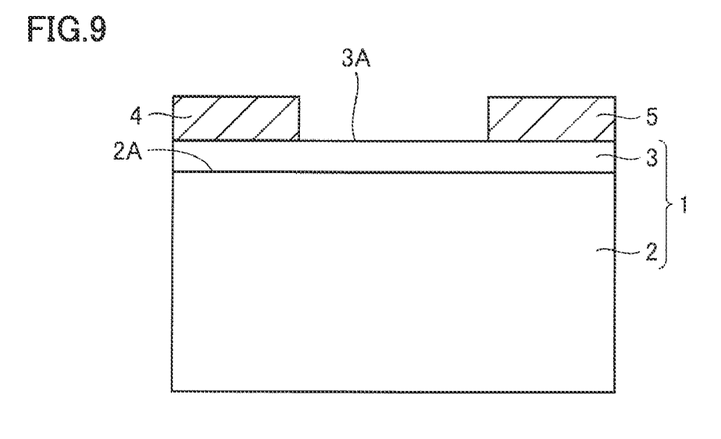
FIG. 9 is a schematic cross-sectional view for illustrating the method for manufacturing a field effect transistor including a graphene film.

Next, referring to FIG. 8, an ohmic electrode forming step is performed as a step (S120). Referring to FIGS. 1 and 9, in this step (S120), source electrode 4 and drain electrode 5 are formed in contact with exposed surface 3A of substrate 1. Source electrode 4 and drain electrode 5 can be formed in the following way, for example. On exposed surface 3A of graphene film 3, a mask layer made of a resist is formed having openings corresponding to respective regions where source electrode 4 and drain electrode 5 are to be formed. Then, an electrically conductive film made of a conductor (Ni/Au, for example) which is to form source electrode 4 and drain electrode 5 is formed, and a lift-off process is performed to thereby form source electrode 4 and drain electrode 5.

Figure 10:
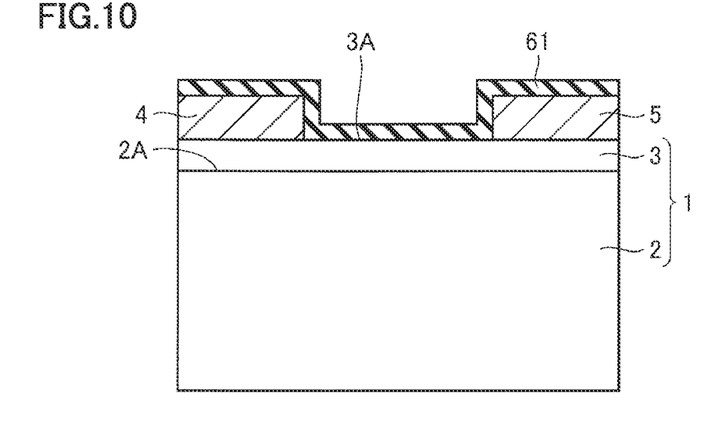
FIG. 10 is a schematic cross-sectional view for illustrating the method for manufacturing a field effect transistor including a graphene film.

Referring next to FIG. 8, an insulating film forming step is performed as a step (S130). Referring to FIGS. 9 and 10, in this step (S130), an insulating film 61 is formed to cover exposed surface 3A of graphene film 3 located between source electrode 4 and drain electrode 5 and to cover the main surface of source electrode 4 which is opposite to substrate 1 and the main surface of drain electrode 5 which is opposite to substrate 1. Insulating film 61 can be formed by CVD, for example. As a material forming insulating film 61, silicon nitride for example may be used.

Figure 11:
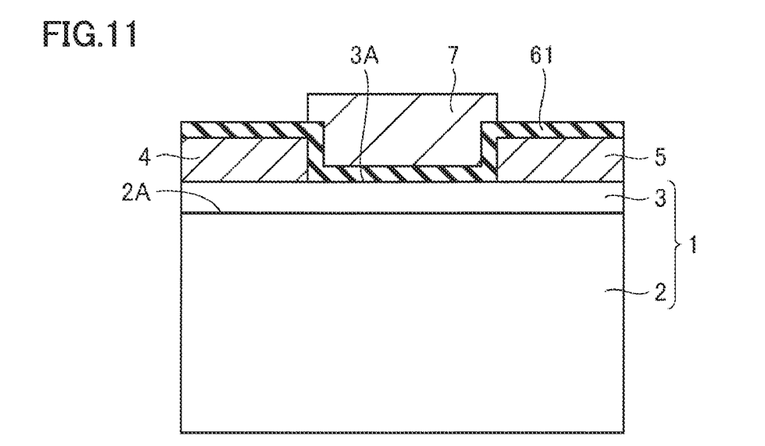
FIG. 11 is a schematic cross-sectional view for illustrating the method for manufacturing a field effect transistor including a graphene film.

Referring next to FIG. 8, a gate electrode forming step is performed as a step (S140). Referring to FIGS. 10 and 11, in this step (S140), gate electrode 7 is formed to contact the top surface of insulating film 61 which covers exposed surface 3A located between source electrode 4 and drain electrode 5. Gate electrode 7 can be formed in the following way, for example. A mask layer made of a resist is formed having an opening corresponding to a region where gate electrode 7 is to be formed. Then, an electrically conductive film made of a conductor (Ni/Au for example) which is to form gate electrode 7 is formed, and a lift-off process can be performed to thereby form gate electrode 7.

Next, referring to FIG. 8, a contact hole forming step is performed as a step (S150). Referring to FIGS. 11 and 7, in this step (S150), insulating film 61 located on source electrode 4 and drain electrode 5 is removed to form a contact hole for enabling contact between an interconnection and source electrode 4 and drain electrode 5. Specifically, for example, a mask is formed having openings in respective regions above source electrode 4 and drain electrode 5, and insulating film 61 exposed from the openings is etched away. In this way, contact holes are formed and remaining insulating film 61 forms gate insulating film 6. Gate insulating film 6 not only covers exposed surface 3A located between source electrode 4 and drain electrode 5 but also extends to regions which partially cover the upper surface (the main surface opposite to the surface contacting graphene film 3) of source electrode 4 and drain electrode 5.

Through these steps, FET 9 of the present embodiment is completed. Interconnections for example are thereafter formed, and each device is separated by dicing.

While the present embodiment is described above in connection with FET 9 including source electrode 4, drain electrode 5, gate insulating film 6, and gate electrode 7 which are formed on exposed surface 3A of substrate 1 of the first embodiment, FET 9 may have a structure having source electrode 4, drain electrode 5, gate insulating film 6, and gate electrode 7 which are formed on exposed surface 3A of substrate 1 of the second embodiment, for example.

INDUSTRIAL APPLICABILITY

The substrate of the present application is particularly advantageously applicable to a substrate and an electronic device including a graphene film required to exhibit a high mobility, for example.

Although the present invention has been described and illustrated in detail, it is clearly understood that the same is by way of illustration and example only and is not to be taken by way of limitation, the scope of the present invention being interpreted by the terms of the appended claims.

What is claimed is:
1. A substrate comprising:
a support substrate having a first main surface and a surface layer region which includes at least the first main surface and is formed of any one material selected from the group consisting of boron nitride, molybdenum disulfide, tungsten disulfide, niobium disulfide, and aluminum nitride; and
a graphene film disposed on the first main surface and having an atomic arrangement oriented in relation to an atomic arrangement of the material forming the surface layer region, wherein
the support substrate includes:
a base substrate; and
a support layer disposed on the base substrate, formed of a material different from the base substrate, and including the first main surface, and
the support layer is the surface layer region.
2. The substrate according to claim 1, wherein the graphene film covers 80% or more of the first main surface.
3. The substrate according to claim 1, wherein carrier mobility in the graphene film is 5000 cm2/Vs or more.
4. The substrate according to claim 1, wherein the surface layer region is formed of boron nitride.
5. The substrate according to claim 1, wherein a region occupying 20% or more by area of the graphene film as seen in plan view has an atomic arrangement oriented in relation to an atomic arrangement of the material forming the surface layer region.
6. The substrate according to claim 1, wherein the support substrate has a disk shape, and the support substrate has a diameter of 50 mm or more.
7. An electronic device comprising:
the substrate as recited in claim 1;
a first electrode disposed on an exposed surface of the graphene film, the exposed surface being a main surface opposite to the support substrate; and
a second electrode disposed on the exposed surface and spaced from the first electrode.

* * * * *